United States Patent
Schmitt et al.

(10) Patent No.: US 6,229,713 B1
(45) Date of Patent: May 8, 2001

(54) COMBINATION EMI SHIELD AND LIGHT CHANNEL

(75) Inventors: Ty R. Schmitt, Round Rock; Andrew L. McAnally, Georgetown, both of TX (US)

(73) Assignee: Dell U.S.A., L.P., Round Rock, TX (US)

( * ) Notice: Subject to any disclaimer, the term of this patent is extended or adjusted under 35 U.S.C. 154(b) by 0 days.

(21) Appl. No.: 09/114,690

(22) Filed: Jul. 13, 1998

(51) Int. Cl.[7] .............................. H05K 9/00; F21V 9/00
(52) U.S. Cl. .......................... 361/818; 361/683; 361/800; 361/825; 174/35 R; 362/248; 362/367
(58) Field of Search ..................... 361/683, 752, 361/800, 816, 818, 825, 807, 808; 174/35 R; 362/84, 179, 765, 367, 800, 248; 206/719

(56) References Cited

U.S. PATENT DOCUMENTS

| | | | |
|---|---|---|---|
| 3,881,795 | * 5/1975 | Cobaugh et al. | 439/63 |
| 4,271,408 | * 6/1981 | Teshima et al. | 345/83 |
| 4,667,270 | * 5/1987 | Yagi | 361/807 X |
| 5,065,188 | * 11/1991 | Kobayashi et al. | 362/800 X |
| 5,226,723 | * 7/1993 | Chen | 362/247 |
| 5,400,229 | * 3/1995 | Lin | 362/249 |
| 5,579,491 | 11/1996 | Jeffries et al. | 395/283 |
| 5,661,585 | 8/1997 | Feldman et al. | 359/180 |
| 5,684,271 | * 11/1997 | Scholder et al. | 175/35 R |
| 5,712,449 | 1/1998 | Miska et al. | 174/35 |
| 5,727,103 | * 3/1998 | Matsusaka et al. | 385/89 |
| 5,754,407 | * 5/1998 | Kohno | 361/809 X |
| 5,822,182 | * 10/1998 | Scholder et al. | 361/683 |
| 5,835,269 | * 11/1998 | Natori | 362/800 X |
| 5,836,676 | * 11/1998 | Ando et al. | 361/244 |

* cited by examiner

Primary Examiner—Jayprakash N. Gandhi
(74) Attorney, Agent, or Firm—Skjerven Morrill MacPherson LLP; Marc R. Ascolese

(57) ABSTRACT

A device that includes multiple light channels for separating the light from adjacent indicating lights and preventing bleed-over can be constructed to include an electrically conductive material so that the device can also serve as an EMI shield to reduce the amount of EMI escaping from a computer system chassis. By reducing light bleed-over from one indicating light to the next, such a device reduces the likelihood that a user will be confused about whether an indicating light is on or off. Additionally, closely spaced indicating lights can be accommodated by slots in the chassis while EMI is reduced by the shielding effects of the light channel device.

22 Claims, 4 Drawing Sheets

COMBINATION EMI SHIELD AND LIGHT CHANNEL

BACKGROUND OF THE INVENTION

1. Field of the Invention

This invention relates to light channels for indicating lights in computer systems and particularly to light channels that include electromagnetic interference (EMI) shielding.

2. Description of the Related Art

Many computer systems, including personal computers, workstations, servers, and embedded systems are designed to have multiple peripheral devices included in the system. A typical personal computer system includes a processor, associated memory and control logic and a number of peripheral devices that provide input and output (I/O) for the system. Such peripheral devices include, for example, compact disk read-only memory (CD-ROM) drives, hard disk drives, floppy disk drives, and other mass storage devices such as tape drives, compact disk recordable (CD-R) drives or digital video/versatile disk (DVD) drives. Additionally, computer systems often have the capability to interface with external enclosures that include additional peripheral devices.

Because these peripheral devices, and other portions of a computer system as well, often have one or more indicating lights, typically light emitting diodes (LEDs), the chassis or enclosure of the computer system is designed to allow the indicating lights to be seen by a user. This is typically accomplished using holes or slots in the chassis or enclosure that correspond with the position of the indicating lights. In computer systems that have a large number of closely spaced indicating lights, for example a server having multiple hard disk drives, each with multiple indicating lights, holes accommodating individual lights often overlap, making a single large slot preferable to several small holes. Although large slots accommodating multiple adjacent holes can be preferable from a manufacturing perspective, large openings in the computer system chassis can lead to electromagnetic interference (EMI) problems.

High speed electronic computer components inside the computer system chassis create radio frequency emissions that can interfere with other devices. Doors, removable panels, displays, ventilation openings, and other holes in the chassis allow unwanted EMI to escape the enclosure. In order to contain the EMI, openings in the chassis must be made as small as possible, or shielding must be provided to minimize the amount of EMI emanating from the chassis.

Additionally, when closely spaced indicating lights are not mounted flush with or protruding from the computer system chassis or enclosure (i.e. the lights are mounted some distance behind the front of the chassis) light from one indicating light is likely to bleed-over to an adjacent indicating light, making it difficult for a user to be certain whether one or both of the two lights are on or off. This problem can be compounded when there is some intervening layer that tends to diffuse the light from the indicating lights, such as, for example, a Mylar® label that adheres to the front of the computer system over the openings for the indicator lights and includes icons for labeling each light's function or purpose.

Accordingly, it is desirable to have a device that can shield some or all of the light from adjacent indicating lights and thereby prevent light bleed-over, while at the same time reducing the amount of EMI the escapes a computer system chassis or enclosure through holes or slots associated with the indicating lights.

SUMMARY OF THE INVENTION

It has been discovered that a device that includes multiple light channels for separating the light from adjacent indicating lights and preventing bleed-over can be constructed to include an electrically conductive material so that the device can also serve as an EMI shield to reduce the amount of EMI escaping from a computer system chassis. By reducing light bleed-over from one indicating light to the next, such a device reduces the likelihood that a user will be confused about whether an indicating light is on or off. Additionally, closely spaced indicating lights can be accommodated by slots in the chassis while EMI is reduced by the shielding effects of the light channel device.

Accordingly, one aspect of the present invention provides an apparatus including a base, a first hole, and a second hole. The base has a first surface, an opposing second surface, and a thickness therebetween, and includes an electrically conductive material. The first hole is sized to accommodate a first light emitting diode (LED) and extends from the first surface to the second surface of the base. The second hole is sized to accommodate a second LED, and extends from the first surface to the second surface of the base. The second hole is located adjacent to the first hole. The thickness of the base is at least as great as the height of either the first LED or the second LED so as to separate some light of the first LED from light of the second LED.

In another aspect of the invention, a computer system includes a processor, a memory coupled to the processor, a chassis supporting the processor and the memory, and a circuit board coupled to the chassis. The circuit board includes first and second LEDs. The computer system also includes a light channel located between the circuit board and the chassis. The light channel has a base, a first hole, and a second hole. The base has a first surface, an opposing second surface, and a thickness therebetween, and includes an electrically conductive material. The first hole is sized to accommodate a first light emitting diode (LED) and extends from the first surface to the second surface of the base. The second hole is sized to accommodate a second LED, and extends from the first surface to the second surface of the base. The second hole is located adjacent to the first hole. The thickness of the base is at least as great as the height of either the first LED or the second LED so as to separate some light of the first LED from light of the second LED.

In still another aspect of the invention, a method is disclosed. In a computer system including a processor, a memory coupled to the processor, a chassis supporting the processor and the memory, and a circuit board coupled to the chassis and including a first light emitting diode (LED) and a second LED, light of the first LED is separated from light of the second LED with a light channel. An exterior of the computer system is shielded from electromagnetic interference (EMI) from an interior of the computer system using the light channel.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
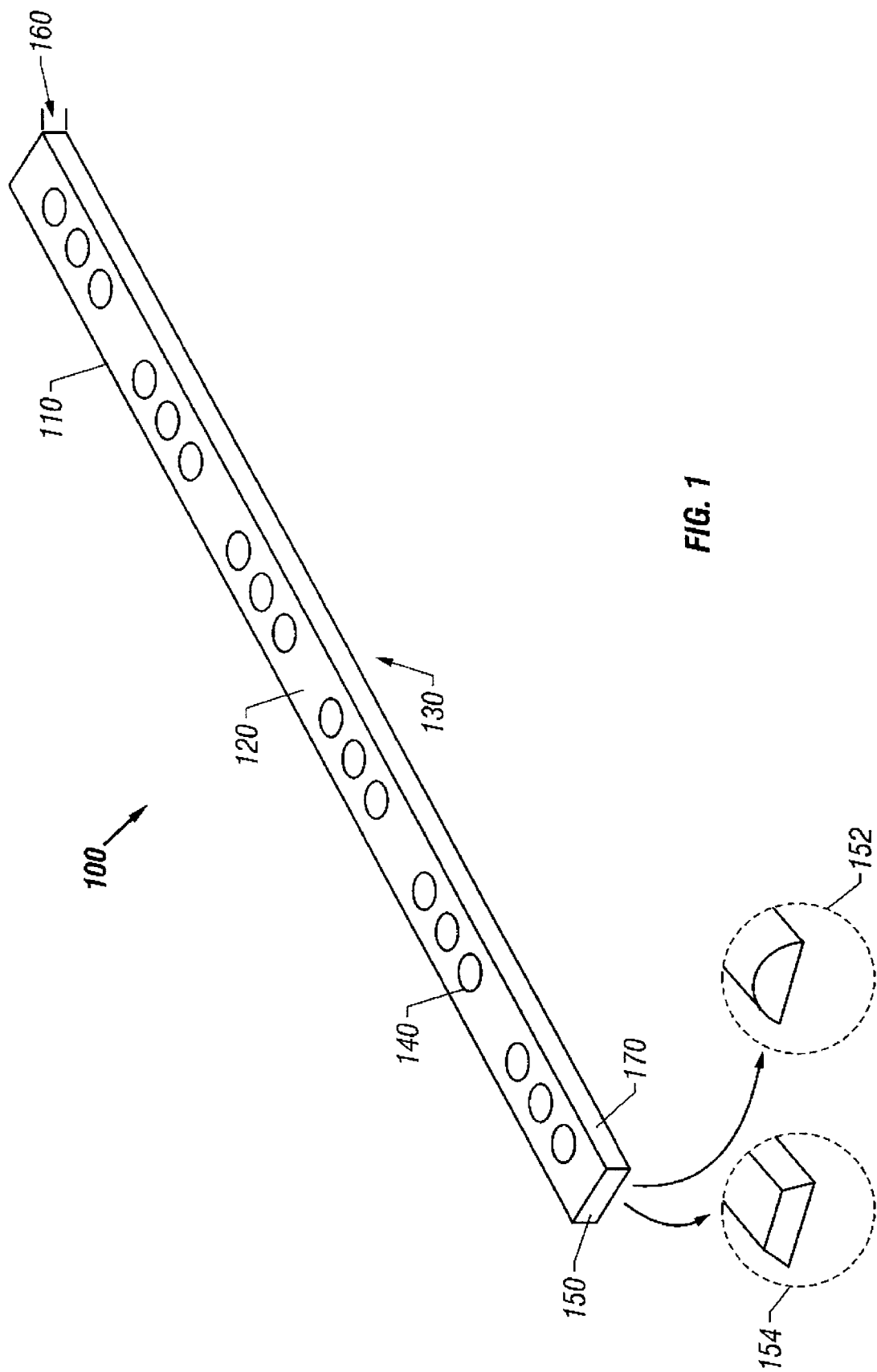
FIG. 1 illustrates a light channel for adjacent indicating lights that includes EMI shielding features.

FIG. 1 illustrates a light channel 100. The light channel includes a base 110 with first and second opposing surfaces 120 and 130, respectively. Cross-section 150 of base 110 shows that light channel 100 has a generally rectangular cross-section, but this need not be the case. For example, the cross-section can be trapezoidal (154), i.e. the width of surface 120 is different from the width of surface 130; semi-circular (152), where surface 120 is curved; or any shape suitable for the particular application and placement of the light channel. Light channel 100 also includes holes 140 that serve to separate light from adjacent indicating lights. Holes 140 extend from surface 120 through base 110 to surface 130, and each accommodates a single indicating light. Holes 140 are shown in groups of three closely spaced holes which correspond to the arrangement of LEDs associated with hard drive power, hard drive activity, and hard drive failure LEDs for each of six hard disk drives in a computer system. The degree to which light from adjacent LEDs is separated (i.e. bleed-over prevention) depends in part on the thickness 160 of the light channel. Light channel 100 also includes an electrically conductive material, either in the base or located on one or both of surfaces 120 and 130, to provide EMI shielding of the exterior of a chassis or enclosure when the light channel is installed.

Light Channel 100 can be constructed from a variety of materials including foams, plastics, metals, composites, fabrics and rubber. The material itself can be electrically conductive for EMI prevention purposes (e.g. conductive foam, conductive plastic, conductive silicone rubber, or metal) or the material can be an electrical insulator with a conductive layer (e.g. foil, wire cloth, conductive fabrics or metallic coatings) either within base 110 or on any of its surfaces. Additionally, the electrically conductive material included in the base (whether the material of the base itself or a layer that is part of the base) should be located or include features such that electrical contact can be made between the light channel and the chassis in which the light channel is installed, thereby providing EMI shielding.

FIG. 1 shows light channel 100 with all of the holes 140 in a single row, but such a layout is not required. The layout for holes 140 is generally dictated by the layout of the indicating lights that the light channel will be used with and thus, a variety of layouts and groupings of holes are possible. Additionally, the size and the shape of holes 140 can vary depending on the type of indicating light (e.g. bulb-shaped or chip-shaped LEDs) with which the light channel is to be used. Moreover, holes 140 need not be continuous as shown, but can also be partially open, for example if the holes are located so that they cut through edge 170.

Figure 2:
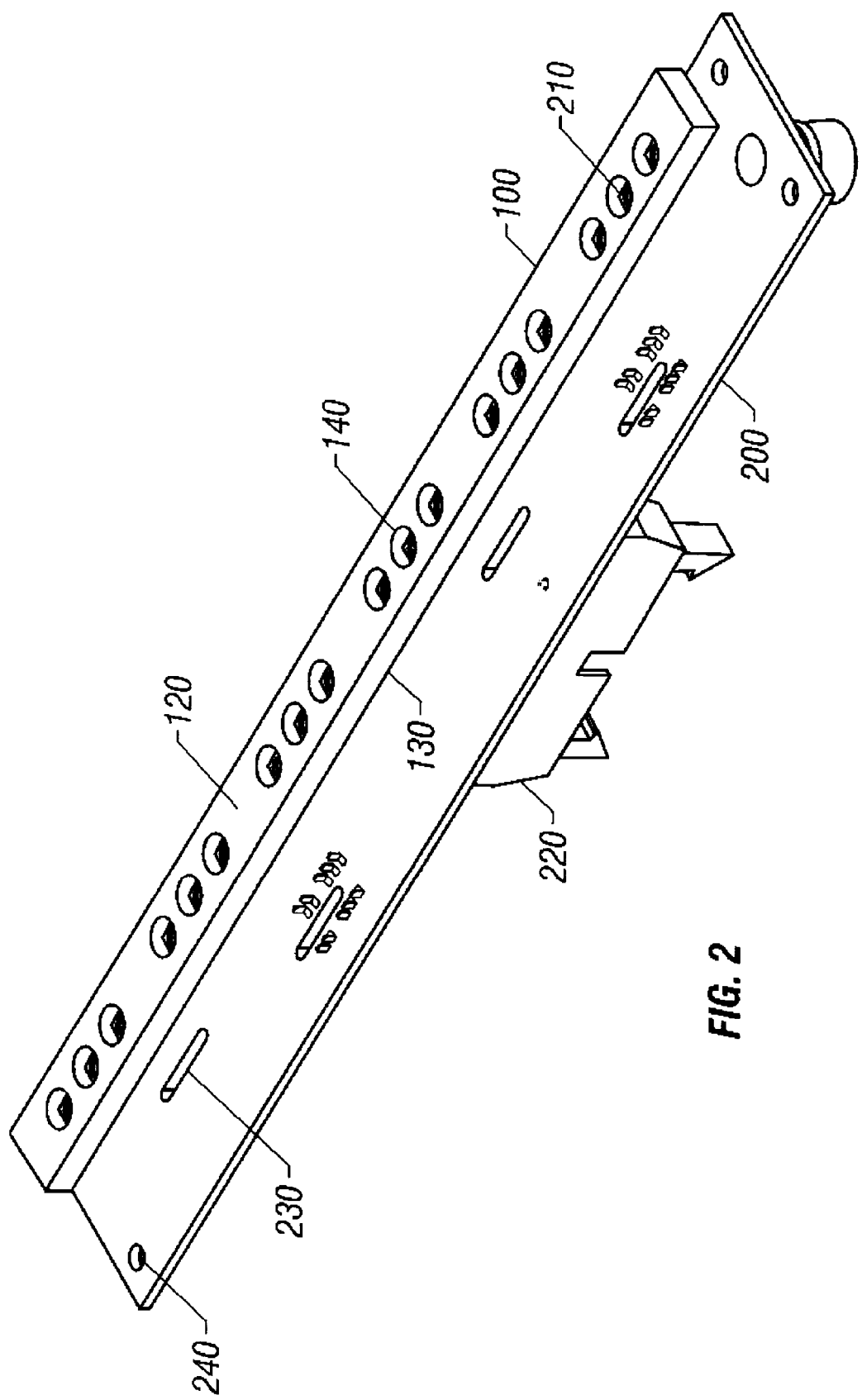
FIG. 2 shows the light channel of FIG. 1 attached to a circuit board having multiple LEDs.

FIG. 2 illustrates light channel 100 installed on a circuit board 200 that includes LEDs 210, circuit board connector 220, and circuit board mounting features 230 and 240. Although LEDs 210 are all shown to be of the same type, different sizes, shapes, or types of LEDs can be used in combination with a single light channel. Additionally, light channel 100 is shown to be much thicker than the height of each of the LEDs, but as pointed out above, the thickness of the light channel will depend on many factors including the amount of light separation desired, the size and shape of the LEDs, the viewing angle of the LEDs, and the location of the LEDs with respect to the computer system chassis. Connector 220 allows the circuit board (and thus the LEDs 210) to be connected to peripheral devices or some other part of the computer system. Mounting features such as slot 230 and through-hole 240 can be used to attach circuit board 200 to the computer system chassis or enclosure.

Light channel 100 can be attached to circuit board 200 using an adhesive such as a spray-on adhesive or a double-sided tape, or may simply rest on the circuit board, being held in place by the fit between LEDs 210 and holes 140, compression between circuit board 200 and the computer system chassis once installed, or by some combination of the two. Alternatively, the light channel may be integrally formed with the circuit board 200. Depending upon the design of the circuit board and the configuration of the electrically conductive material included in light channel 100, an insulating layer may separate circuit board 200 (and its electrical components) from the light channel.

Figure 3:
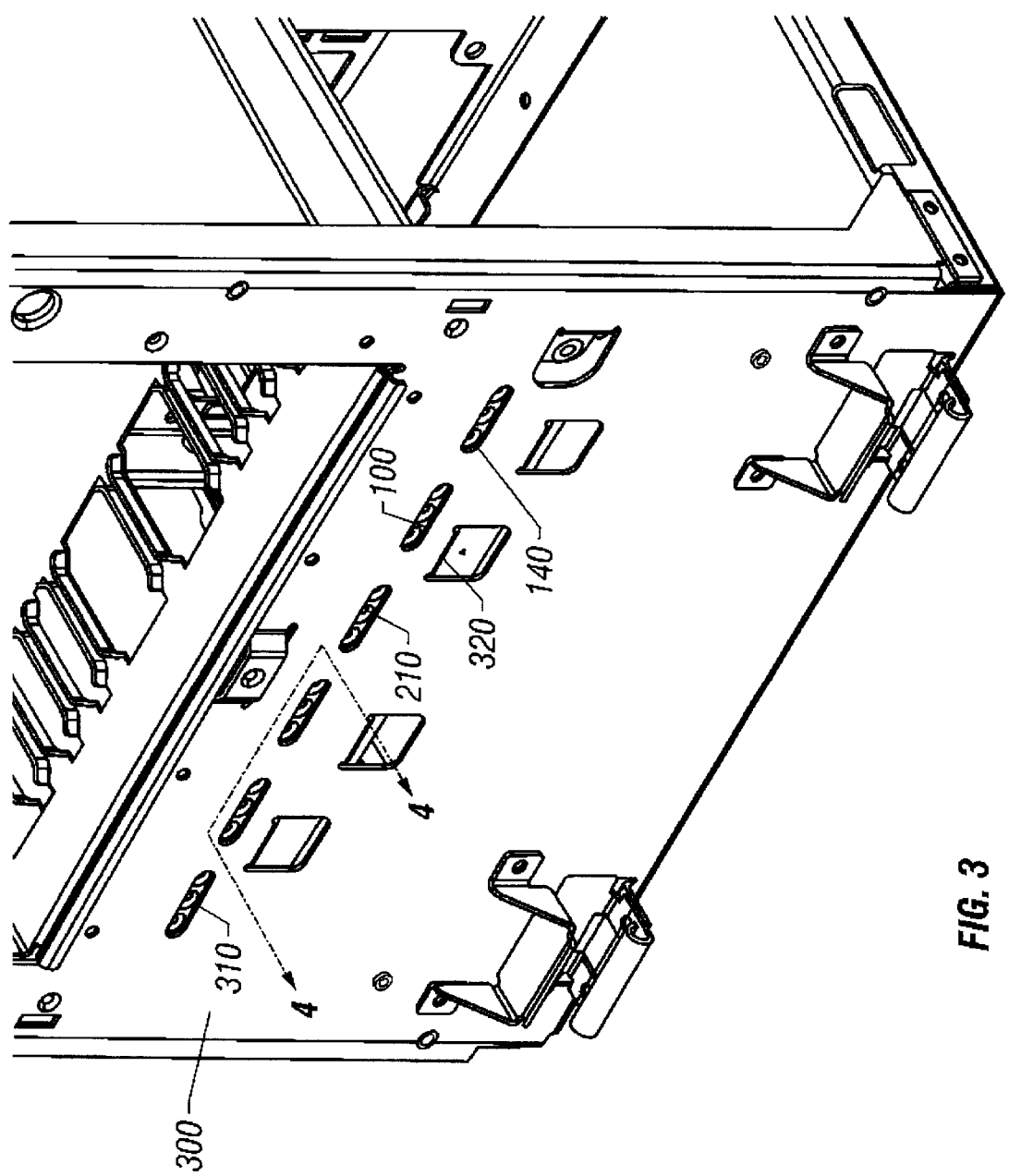
FIG. 3 illustrates the light channel and circuit board as installed in the chassis of a computer system.
Figure 4:
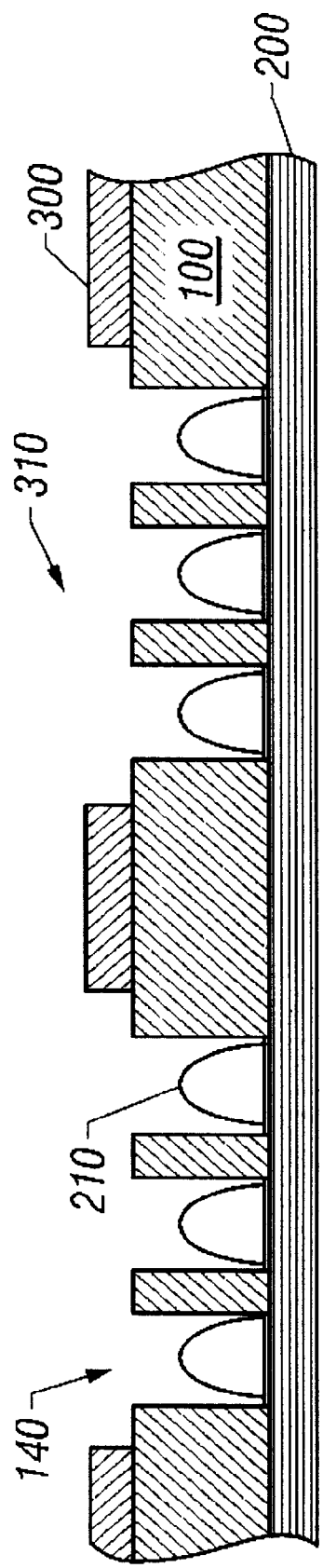
FIG. 4 shows a cross-sectional view of the installed circuit board and light channel from FIG. 3.

FIG. 3 illustrates light channel 100 and circuit board 200 as installed in the chassis 300 of a computer system. Slots 310 are formed in chassis 300 to allow light from LEDs 140 to be seen by a user. Each of the holes 140 of light channel 100 separates some or all of the light from adjacent LEDs, and the electrically conductive material included in the light channel, for example a metal film on the surface of the light channel that is touching the chassis, provides EMI shielding. Chassis features such as tab 320 can be uses to secure circuit board 200 to the chassis. FIG. 4 shows a cross-section of circuit board 200 and light channel 100, as installed in chassis 300. Note that to ensure a secure fit and good electrical contact between light channel 100 and chassis 300, it may be preferable to use a compressible material such as silicone rubber or foam for the light channel. As indicated by FIG. 4, the thickness of light channel 100 is selected to provide the desired amount of light separation for the LEDs in use, given their physical characteristics and their location with respect to the chassis.

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. An apparatus comprising:
    a base having a first surface, an opposing second surface, and a thickness therebetween, the base including an electrically conductive material;
    a first hole sized to accommodate a first light emitting diode (LED), the first hole extending from the first surface to the second surface of the base; and
    a second hole sized to accommodate a second LED, the second hole extending from the first surface to the second surface of the base and being located adjacent to the first hole, the thickness of the base being at least as great as the height of one of the first LED and the second LED so as to separate some light of the first LED from light of the second LED.

2. The apparatus of claim 1 wherein the electrically conductive material is one of a foil, a metallic plate, wire cloth, a metallic coating, a conductive foam, a conductive plastic, and a conductive silicone rubber.

3. The apparatus of claim 1 wherein the electrically conductive material is located on one of the first surface and the second surface.

4. The apparatus of claim 1 wherein the base is entirely constructed from the electrically conductive material.

5. The apparatus of claim 1 wherein the thickness of the base is at least as great as the height of the first LED and the second LED.

6. The apparatus of claim 1 wherein the thickness of the base is at least twice as great as the height of the first LED and the second LED.

7. The apparatus of claim 1 wherein a cross-section of the base is one of rectangular, trapezoidal, and semicircular.

8. The apparatus of claim 1 wherein the thickness of the base is great enough to separate substantially all of the light of the first LED from light of the second LED.

9. The apparatus of claim 1 wherein the base is integrally formed from a circuit board.

10. A computer system comprising:

a processor;

a memory coupled to the processor;

a chassis supporting the processor and the memory;

a circuit board coupled to the chassis and including a first light emitting diode (LED) and a second LED; and a light channel located between the circuit board and the chassis, the light channel including:
   a base having a first surface, an opposing second surface, and a thickness therebetween, the base including an electrically conductive material;
   a first hole sized to receive the first LED, the first hole extending from the first surface to the second surface of the base; and
   a second hole sized to receive the second LED, the second hole extending from the first surface to the second surface of the base and being located adjacent to the first hole, the thickness of the base being at least as great as the height of one of the first LED and the second LED so as to separate some light of the first LED from light of the second LED.

11. The computer system of claim 10 wherein the electrically conductive material is in electrical contact with the chassis.

12. The computer system of claim 10 wherein the location of the first and second LEDs corresponds to an opening in the chassis.

13. The computer system of claim 10 wherein the electrically conductive material is one of a foil, a metallic plate, wire cloth, a metallic coating, a conductive foam, a conductive plastic, and a conductive silicone rubber.

14. The computer system of claim 10 wherein the electrically conductive material is located on one of the first surface and the second surface.

15. The computer system of claim 10 wherein the base is entirely constructed from the electrically conductive material.

16. The computer system of claim 10 wherein the thickness of the base is at least as great as the height of the first LED and the second LED.

17. The computer system of claim 10 wherein the thickness of the base is at least twice as great as the height of the first LED and the second LED.

18. The computer system of claim 10 wherein a cross-section of the base is one of rectangular, trapezoidal, and semicircular.

19. The computer system of claim 10 wherein the thickness of the base is great enough to separate substantially all of the light of the first LED from light of the second LED.

20. In a computer system including a processor, a memory coupled to the processor, a chassis supporting the processor and the memory, and a circuit board coupled to the chassis and including a first light emitting diode (LED) and a second LED, a method comprising:

separating light of the first LED from light of the second LED with a light channel; and shielding an exterior of the computer system from electromagnetic interference (EMI) from an interior of the computer system using the light channel.

21. The method of claim 20 wherein shielding the exterior of the computer system includes locating an electrically conductive portion of the light channel in electrical contact with the chassis.

22. The method of claim 20 wherein shielding the exterior of the computer system includes locating a portion of the light channel so as to at least partially obstruct an opening in the chassis.

* * * * *